United States Patent [19]
Nicolai

[11] Patent Number: 5,070,311
[45] Date of Patent: Dec. 3, 1991

[54] INTEGRATED CIRCUIT WITH ADJUSTABLE OSCILLATOR WITH FREQUENCY INDEPENDENT OF THE SUPPLY VOLTAGE

[75] Inventor: Jean Nicolai, Aix En Provence, France

[73] Assignee: SGS-Thomson Microelectronics SA, Gentilly, France

[21] Appl. No.: 547,878

[22] Filed: Jul. 3, 1990

[30] Foreign Application Priority Data

Jul. 7, 1989 [FR] France ................................ 89 09197

[51] Int. Cl.$^5$ ............................................ H03K 3/02
[52] U.S. Cl. .............................. 331/111; 331/108 C; 331/143; 331/177 R; 331/179
[58] Field of Search ................. 331/1 A, 34, 111, 143, 331/175, 176, 177 R, 177 V, 108 C, 179, DIG. 3

[56] References Cited

U.S. PATENT DOCUMENTS

| | | | |
|---|---|---|---|
| 4,691,124 | 7/1987 | Ledzius et al. ...................... | 307/303 |
| 4,723,114 | 2/1988 | D'Arrigo et al. .................... | 331/111 |
| 4,767,979 | 8/1988 | Tanigawa ............................ | 323/316 |

FOREIGN PATENT DOCUMENTS 0165748 12/1985 European Pat. Off. .
0296668 12/1988 European Pat. Off. .

Primary Examiner—David Mis
Attorney, Agent, or Firm—Roland Plottel

[57] ABSTRACT

The disclosure concerns the fabrication of integrated circuits. To enable the making, in an integrated circuit, of an internal clock, the frequency of which is adjustable and does not depend on the general supply voltage Vcc of the circuit, a relaxation oscillator is used. This relaxation oscillator is built in the following way: weighted individual current sources may be selectively connected in parallel under the control of a register containing frequency adjusting data. These sources charge and discharge a capacitor. A threshold comparator determines a high threshold Vh and a low threshold Vb to trigger respectively the discharging and the charging of the capacitor. The difference Vh−Vb is made proportional to the currents of the elementary sources. Thus, even if the value of the currents varies as a function of the supply voltage, the thresholds vary at the same time and the period of the oscillator does not vary.

10 Claims, 2 Drawing Sheets

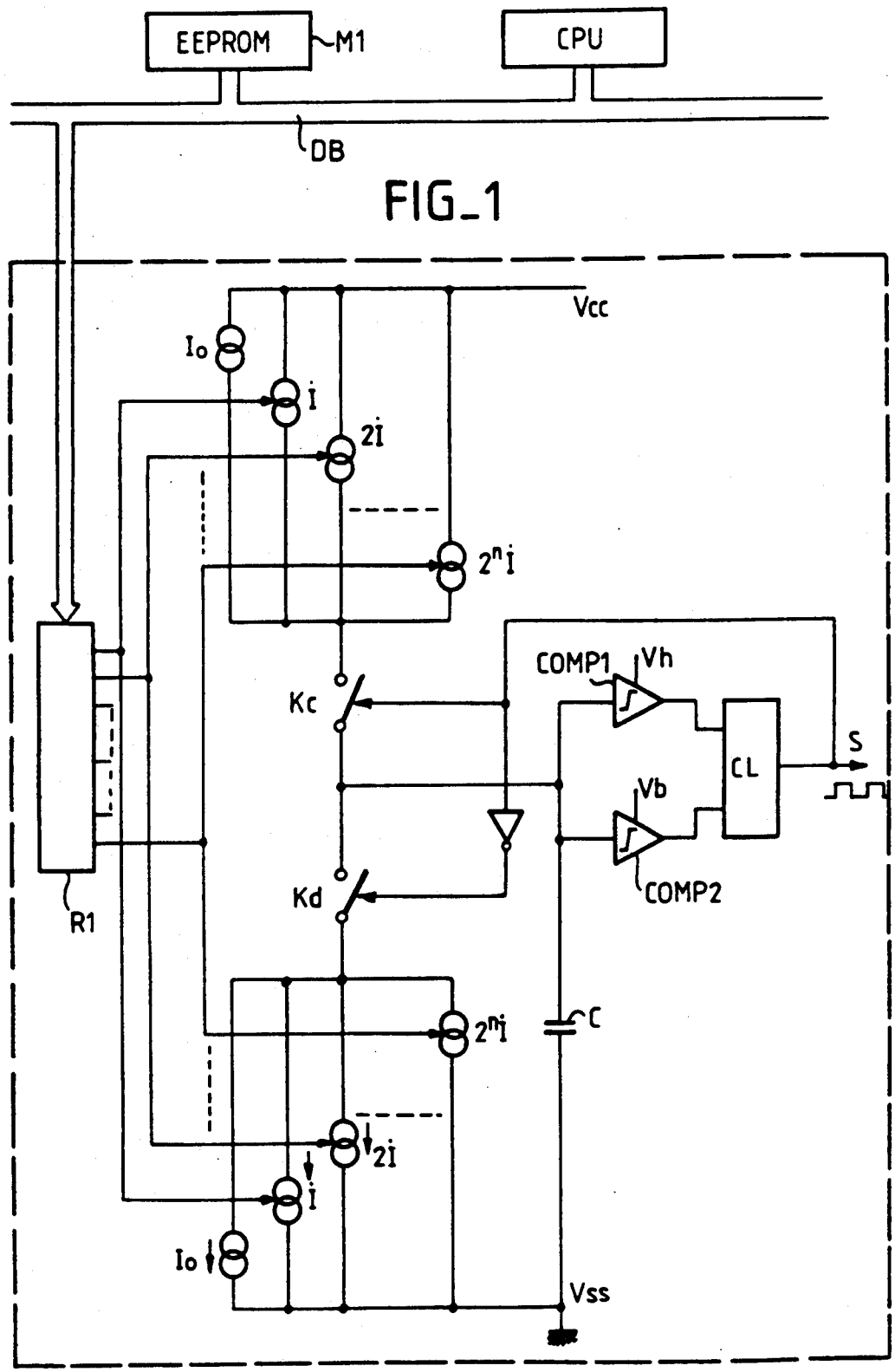
FIG_1

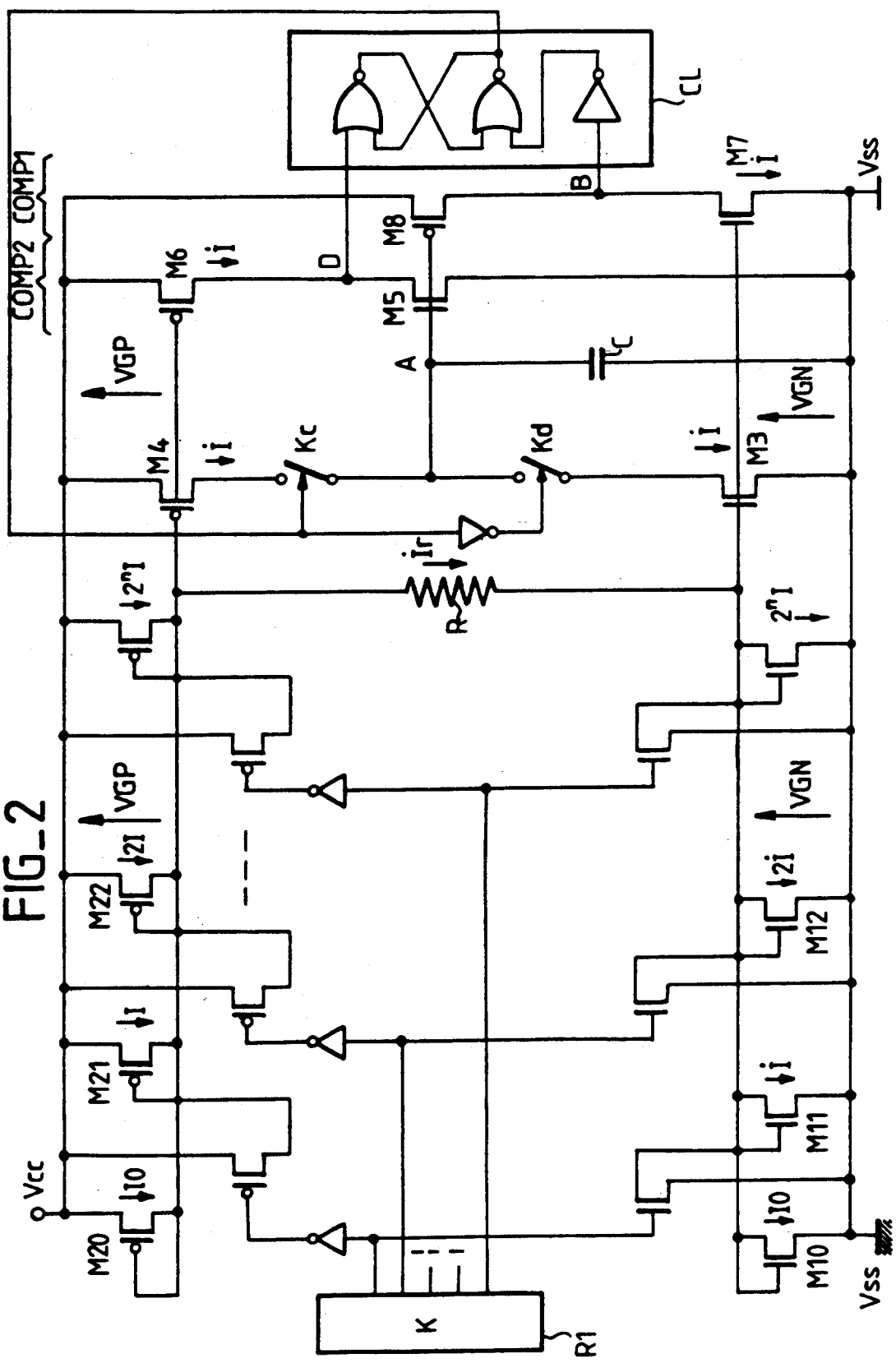
FIG_2

INTEGRATED CIRCUIT WITH ADJUSTABLE OSCILLATOR WITH FREQUENCY INDEPENDENT OF THE SUPPLY VOLTAGE

BACKGROUND OF THE INVENTION

The invention concerns the manufacture of integrated circuits.

In many integrated circuits, it is necessary to have a clock available. This is the case, for example, with a signal processor which, at all events, requires a clock that provides for the smooth sequencing of the processing operations performed.

The clock may be set up by means of an oscillator internal to the integrated circuit, or else the clock signals may be applied from the outside of the integrated circuit, to a terminal specially reserved for this purpose.

The use of an external clock compells the user of the integrated circuit to provide for this clock, and this indirectly increases the cost of the circuit for the user. Furthermore, it makes it necessary to have a circuit terminal reserved for the clock.

When an oscillator is made on an integrated circuit, the difficulty lies in the precise obtaining of a desired frequency. Indeed, such are the manufacturing variations resulting from the technological processes used that it is not possible to obtain a frequency with sufficient precision. The variation in the natural frequency of oscillation obtained for two identical oscillators coming from the same production line is easily 100% or even more. This results from the fact that the manufacturing processes involve steps for doping, diffusion of impurities at high temperature, deposition of thin insulator layers etc. It is not very easy to achieve full control over the reproducibility of these steps from one circuit to the next.

Moreover, when an internal oscillator is made in the integrated circuit, it is perceived that its frequency varies as a function not only of the variations in manufacture but also of the supply voltage of the circuit. This results from the fact that the frequency of the oscillator depends on the currents that flow through it, and these currents themselves depend on the general supply voltage of the circuit.

Either the oscillation frequency is not of vital importance, and then it is possible to accept an oscillator that is entirely integrated into the circuit, without any external terminal for the reception of a clock signal. Or, on the contrary, the frequency is a vitally important parameter and, in this case, the approach generally used lies in connecting, to the exterior of the integrated circuit, elements (usually resistors or capacitors) for adjusting or controlling the internal oscillator. These adjusting elements have a value that is very precisely known, either because they are not subject to the same manufacturing variations or because they have been selected. However, the drawback is that they must be connected directly to the oscillator of the integrated circuit and, consequently, they make it necessary for the integrated circuit to have additional external pins, specially reserved for this use. Additional external pins are to be avoided to the utmost extent however for they are the biggest factors of cost in integrated circuits.

In a signal processor, namely an electronic circuit capable of carrying out various signal processing tasks under control by instruction, the clock that determines the sequencing of the operations carried out by the microprocessor is a very important circuit element and its frequency has to be well determined. In the signal processing circuits made at present, the clock is external, or it is internal and adjusted by precise external components (quartz elements, resistors, capacitors etc.).

SUMMARY OF THE INVENTION

An aim of the invention is to propose an integrated circuit comprising an internal clock that is not subject to the drawbacks just described, notably the drawback of a variation in frequency as a function of the supply voltage.

Another aim of the invention is to propose a circuit that is not subject to the drawbacks resulting from technological variations among circuits that are identical in theory.

Another aim of the invention is to enable the making of an integrated circuit having a clock, the frequency of which can be defined easily and with precision, without making it necessary to have specific connector pins to connect external adjusting elements to an internal oscillator.

Finally, an aim of the invention is, very specially, the making of a signal processor having a clock to provide for the sequencing of its own operations, said clock having a frequency that can easily be defined by the processor itself, and which does not vary with the supply voltage.

To achieve these various aims, the present invention proposes an integrated circuit including a relaxation oscillator that has a capacitor and means for charging and discharging the capacitor, a threshold comparator to trigger the charging of the capacitor when the voltage at the terminals of this capacitor goes below a low threshold Vb and to trigger the discharging of the capacitor when the voltage at the terminals of this capacitor goes above a high threshold Vh, wherein said oscillator further includes a register containing data for adjusting the frequency of the oscillator, said register controlling the selective parallel connection of elementary current sources as a function of its contents, the capacitor charging and discharging currents being linked to the currents of the elementary sources thus connected in parallel, and wherein the comparator sets up high and low thresholds Vh and Vb such that Vh−Vb is proportional to the current for charging and discharging the capacitor.

With this proportionality, it is possible to make the oscillation frequency independent of the supply voltage (the supply voltage causing a high variation in the value of the elementary current sources but having no effect, even so, on the frequency of the oscillator, as shall be seen).

The register may be charged with a numerical value representing a frequency of the oscillator or a correction of a basic frequency of the oscillator. As shall be seen, this digital value may take account of correction data resulting from the uncertainty of the base frequency of the oscillator, because of technological variations in manufacturing.

The elementary current sources preferably have values that are weighted, for example, according to a pure binary code, with the bits of the register having a corresponding weighting or significance.

Should the integrated circuit include a signal processor, it is preferably provided that this processor be capable of loading a desired value into the register. This value may come, if desired, from a non-volatile (EPROM or EEPROM) memory that is formed on the same integrated circuit substrate. This memory may contain precisely the frequency correction data set up individually for the circuit during its electrical testing (after encapsulation).

It will be noted that, in the case of the signal processor, the items of data for frequency adjustment may go through the data input/output terminals of the processor. These are external terminals which have been obligatorily provided in the integrated circuit, and there is therefore no need to provide for additional connection terminals for the connection of frequency adjusting elements (resistors or capacitors).

The invention is particularly useful when the oscillator concerned is precisely the one used to set up clock signals for the operation of the signal processor itself.

The practical embodiment of the oscillator preferably takes the following form: the capacitor charging and discharging currents are set up by the copying of the currents generated in a series-mounting of two transistors with a resistor interposed between these two transistors. To set up a comparison threshold, a series-mounting of two transistors is used. One of these transistors is mounted as a current mirror with the transistor for charging (or respectively for discharging) the capacitor. The other transistor has its gate connected to the capacitor and has a geometry chosen so as to conduct a current of a value substantially equal to that of the current of the first transistor when it receives a voltage substantially equal to the gate/source voltage of the transistor giving the current for discharging (or respectively for charging) the capacitor.

The above-mentioned resistor is preferably crossed by a current generated by the parallel connection of several branches containing transistors mounted as current mirrors with respect to one another, having all their gates and their drains connected together and having geometries weighted with respect to one another, these branches being parallel connected under the control of the register.

BRIEF DESCRIPTION OF THE DRAWING

Other characteristics and advantages of the invention will appear from the following detailed description made with reference to the appended drawings, in which:

FIG. 1 is a general diagram of an embodiment of an integrated circuit according to the invention.

FIG. 2 is a detailed diagram of an exemplary embodiment of the oscillator in CMOS technology.

DESCRIPTION OF A PREFERRED EMBODIMENT

The invention shall be described more particularly with reference to the embodiment of an integrated circuit including a microprocessor and using an oscillator OSC to define a clock frequency used for the sequencing of the tasks performed by the microprocessor.

The oscillator is entirely integrated into the same semiconductor substrate as the microprocessor. It is an oscillator with variable frequency. The frequency can be adjusted under the control of a register R1, the contents of which can be loaded by the microprocessor.

The microprocessor has been shown only very partially in the figure. In a standard way, it includes a central processing unit CPU connected to a data bus (or address and data bus) DB enabling the exchange of data notably with memories (random-access, read-only or non-volatile memories), input/output ports of the integrated circuit and internal registers of the integrated circuit.

Among the memories connected to the bus DB, there is provision for an electrically-programmable memory M1, preferably an electrically-erasable programmable read-only memory (EEPROM). However, this memory may be one that is not electrically erasable.

The memory M1 may have various uses in the circuit, i.e. it is not specially reserved for the adjusting of frequency according to the invention. In this case, a specific zone of the memory will be reserved so as to contain, according to the invention, items of data pertaining to the frequency that the oscillator should have.

Among the registers connected to the bus DB, there is provision for a specific register R1 designed to contain, during operation, items of data related to the data contained in the memory M1. It is the register R1 that controls the automatic adjusting of the frequency of the oscillator. Further on, we shall describe the way in which this adjusting is done.

At the end of the manufacture of the integrated circuit, it is usual to conduct tests. In particular, final tests are made after the encapsulation of the circuit into a package, when only the external access pins of the integrated circuit remain accessible. Among these tests, a measurement is taken of the natural frequency of the oscillator OSC. The difference existing between the frequency of the oscillator and the desired frequency is deduced therefrom, this difference being due to uncontrollable fluctuations in the parameters of the various technological manufacturing steps (times, temperatures, doses, etc.).

A command is then given to store an item of information, corresponding to this difference, in the memory M1. The microprocessor can do this storage itself.

During the use of the circuit, this item of information is used for the systematic correction of the frequency of the oscillator so that it really takes the desired value.

For example, provision may be made for the powering of the integrated circuit to prompt a systematic step for the transfer, into the register R1, of the corrective information contained in the memory M1.

As long as the microprocessor remains supplied with power, the register R1 will preserve this data and permanently correct the frequency of the oscillator OSC.

Should the oscillator be the one to enable the clock signals of the microprocessor to be set up, it is preferable that the oscillator work, at the outset, with a relatively low frequency. For this purpose, at the outset, when the power is turned on, it will be ensured that the register R1 is systematically reset at zero (this is generally what initializing circuits do in all microprocessors) and provision will be made for the zero content of the register to correspond to a relatively low frequency. The starting-up program of the processor will then load the register to obtain the desired working frequency.

With one correction eight-bit byte, it is possible to correct the frequency, for example, by steps of 2% in a range of technological fluctuations of about 200%.

The oscillator OSC shown in the FIG. 1 is a relaxation oscillator using a capacitor C that can be charged by an adjustable charging current i and discharged by a discharging current that is preferably equal to the charging current and which flows in the reverse direction in the capacitor.

The entire oscillator is supplied between two supply terminals, one of which is at a low potential Vss while the other is at a high potential Vcc.

The charging current is produced for example by a set of several current sources connected between Vcc and the capacitor (the latter, moreover, having one terminal at Vss). These current sources may be placed in parallel under the control of the register R1, as a function of the pieces of data contained in this register, to obtain a charging current of variable value.

In the same way, the discharging current is produced by a set of current sources connected to the terminals of the capacitor. These sources may also be connected in parallel under the control of the register R1, as a function of the pieces of data contained in this register, to set up a discharging current of variable value.

The simplest approach lies in the use of a binary weighting system, wherein the bits stored in the register R1 are placed in increasing order of their weighting or significance, and each bit controls a current source of a corresponding weighted value. Thus, the first bit of the register (the least significant bit) may control a source of charging current with a value I and, simultaneously, a source of discharging current with the same value I. The second bit of the register controls a source of charging current with a value 2I and a source of discharging current with a value 2I; and so on and so forth, the $n^{th}$ bit controls a source of charging current and a source of discharging current with a value $2^n I$.

Thus, depending on the contents of the register, we obtain a charging and discharging current i that is variable between 0 and $(2^{n+1} - 1)I$, in steps equal to I. This current may be the main charging and discharging current or it may be placed in parallel with a basic charging or discharging current I0, in which case the register is used to correct the value of this current I0 (the charging current being I0 for a zero content of the register).

The charging current i, formed by the sum of the current I0 and the currents individually put into operation by the register, is transmitted to the capacitor C by means of a switch Kc that is closed only during the charging of the capacitor.

Reciprocally, the discharging current i is transmitted by means of a switch Kd that is closed only during the discharging.

The switches Kc and Kd are switched over in phase opposition by threshold comparators COMP1 and COMP2 connected to the capacitor. The threshold comparator COMP1 has the function of interrupting the charging of the capacitor and of starting up its discharging when the voltage at its terminals reaches a high threshold Vh. The comparator COMP2 has the function of interrupting the discharging of the capacitor and recommencing the charging when the voltage at the terminals of the capacitor reaches a low threshold Vb. A logic circuit CL (RS type flip-flop circuit) receiving the outputs of the comparators gives the control signals for the switches Kc and Kd. The output S of this logic circuit CL is the output of the oscillator OSC. It gives square wave pulses at a frequency that is related to the value (adjustable by the register R1) of the charging and discharging current, to the value of the capacitor C and, finally, to the value of the difference between the high and low thresholds, Vh and Vb, of the comparators COMP1 and COMP2.

Since the technology is generally such that the currents I and I0 depend on the value of the supply voltage Vcc, the comparators COMP1 and COMP2 are designed to be built out of current sources made in the same way as the sources of charging and discharging current I0, I, 2I, etc. More precisely, the comparators COMP1 and COMP2 are designed to be built so that the difference in thresholds Vh−Vb remains proportional to the current I of an elementary current source. In this way, the charging and discharging duration becomes independent of the voltage Vcc. If the charging is slower because the elementary current I is weaker, the difference in voltage Vh−Vb which, with the current, defines the duration of the charging, will be proportionally smaller. In its totality, the charging and discharging duration, hence the frequency of the oscillator, will be constant and will not depend on the modifications in current due to the modifications in supply voltage. It will depend only on the contents of the register R1 and on the parameters of technological construction of the circuit, notably the value of the capacitor C.

It is quite possible, in the technology of integrated circuits, to make current sources, the values of which are proportional to one another with a precisely known coefficient of proportionality, even if neither the absolute value of these currents nor their dependence with respect to the supply voltage is known.

If the register R1 is used essentially to receive a frequency correction related to technological fluctuations, it is by this register that the value of the capacitor C (subject to technological fluctuations) will be taken into account.

FIG. 2 shows a detailed view of an exemplary embodiment of the oscillator according to the invention.

For convenience of construction, the current for charging the capacitor C is not obtained directly in this embodiment by the parallel connection of several current sources controlled by the register R1. It is obtained from a current mirror copying a reference current. More indirectly, however, it remains linked to the contents of the register R1.

This reference current is not fixed. It varies as a function of the contents of the register and is also used to define gate/source voltages of transistors that will set up the comparison thresholds in the comparators COMP1 and COMP2.

The reference current, designated by Ir, is set up in a resistor R in the following way: a first group of weighted elementary current sources, controlled by the register R1, is connected in parallel between the low voltage supply terminal Vss and a first end of the resistor R. These current sources, controlled by the register, are formed by N channel transistors M10, M11, M12 etc., all mounted as current mirrors and having geometries that are perfectly defined with respect to one another, according to a weighting or significance that corresponds to the weighting of the bits of the register R1. The transistor M10 defines a base current I0. M11 corresponds to a source of elementary current with a value I. M12 corresponds to an elementary current source of double current 2I, etc. In principle, every one of these transistors has its gate connected to its drain. These current sources are put into operation or disconnected under the control of the bits of the register, by means of switches formed by respective transistors which, in cancelling the gate/source voltage of the transistors M11, M12 etc., can turn them off individually as wished.

Symmetrically, sources forming another set of current sources M20, M21, M22 etc., this time of the P channel type, are connected in parallel (as a function of the state of the bits of the register) between the other supply terminal Vcc and the second end of the resistor R. The transistors M20, M21, M22 etc. are also all mounted as current mirrors with respect to one another and have geometries that are perfectly defined with respect to one another according to the same weighting or significance as the respective bits of the register that enable them to be put into operation or out of operation. Every one of them has its gate connected to its drain.

By the expression "current mirror mounting" is meant the very standard mounting of transistors that have their sources connected together and their gates connected together, and conduct currents proportional to their geometry, i.e. to their canal width/length ratio.

When the circuit functions, a current Ir is set up in the resistor R. This current Ir is the sum of the currents of all these current sources.

If I is the current flowing through the transistors M11 and M21, which have a geometry that defines the lowest significance and are controlled by the least significant bit of the register R1, it may be written that the current Ir is:

$$Ir = (K + K0)I,$$

where K (binary number) represents the contents of the register and K0 (not necessarily a whole number) represents the ratio between the base current I0 and the least significant elementary current I.

A potential difference RIr is then set up in the resistor R.

The result thereof is that, by subtraction, a potential difference VGN arises between gate and source of the N channel transistors M10, M11, M12, ..., and a potential difference VGP arises between source and gate of the P channel transistors M20, M21, M22, ..., such that:

$$Vcc - Vss - (VGP + VGN) = RIr = R(K + K0)I$$

An equilibrium is thus set up, linking the voltages VGN and VGP to the reference current Ir. The gate/source voltages VGN and VGP depend, without there being a precise control thereof, on the characteristics of the transistors, the value of the resistor R and the value of the supply voltage Vcc—Vss, but they are also linked directly and in a known way to the contents of the register. These voltages VGN and VGP will act as a voltage reference for the comparators.

The principle of construction of the oscillator according to the invention then consists, as shall be seen, in setting up, firstly, currents for charging and discharging the capacitor C which are proportional to the current I (by the use of current mirrors) and, secondly, a difference in comparator thresholds that is precisely equal to Vcc—Vss—VGP—VGN (also by means of current mirrors), and is therefore, as a consequence, also proportional to the current I, but with a coefficient of proportionality that depends on the contents of the register K (and is hence known and adjustable).

The principle used in the embodiment of FIG. 2 to make Vh—Vb proportional to the charging and discharging current makes it necessary for the charging and discharging current to be controlled not directly by the register R1 but only through current mirrors. However, this enables the comparators COMP1 and COMP2 to be made very simply, with only two transistors each.

The current for charging the capacitor C, set up during the periods of charging by the switch Kc, is given by a P channel transistor M4 mounted as a current mirror with respect to the current sources M20, M21, M22, etc. It gives a current proportional to I, for example equal to I to simplify matters, if its geometry is the same as that of M21.

In the same way, the capacitor C discharging current, set up during the discharging periods by the switch Kd, is given by an N channel transistor M3 mounted as a current mirror with respect to the current sources M10, M11, M12 etc. It therefore also gives a discharging current proportional to I, preferably equal to I, its geometry then being the same as that of M11.

As can be seen in FIG. 2, during the charging, the transistor M4 is mounted between a terminal A of the capacitor C and the terminal Vcc. The other terminal of the capacitor is at the ground (Vss). The transistor M3 is disconnected. During the discharging, the transistor M4 is disconnected from the terminal A and the transistor M3 is connected between the terminal A and Vss.

Hence, charging and discharging currents that depend only on the base current I of the elementary sources are set up in the capacitor, and the precision with respect to the geometrical ratios of the different transistors of an integrated circuit may be considered to be very high in the application described herein.

Comparator thresholds Vh and Vb remain to be established in such a way that Vh—Vb is equal to Vcc—Vss—(VGP—VGN) and is therefore also proportional to I.

The first comparator COMP1, defining the high threshold Vh, is formed by a set of two transistors M7 and M8, series connected between Vss and Vcc. M7 is an N channel transistor mounted as a current mirror with respect to the other N channel transistors already mentioned. It therefore tends to be crossed by a current proportional to I, preferably equal to I if it has a geometry equal to that of M11. The transistor M8 is a P channel transistor. Its gate is controlled by the terminal A of the capacitor, and it can therefore be made conductive or turned off depending on the capacitor charging voltage. If the transistor M7 has a geometry chosen so that it conducts a current I, then the transistor M8 has a geometry chosen so that it conducts substantially a current I when it has substantially the same gate/source voltage VGP as the transistors M20, M21, M22.

The second comparator COMP2, defining the low threshold Vb, is also formed by a set of two transistors M5 and M6, series connected between Vss and Vcc. M5 is an N channel transistor, the gate of which is controlled by the terminal A of the capacitor. M6 is a P channel transistor mounted as a current mirror with the P channel transistors already mentioned and tending therefore to set up, in the branch M5, M6, a current proportional to I, preferably equal to I, if it has a geometry equal to that of M21. If M6 has a geometry for conducting a current I, then M5 is given a geometry for conducting substantialy a current I when it has substantially the same gate/source voltage VGN as the transistors M10, M11, M12.

The comparators work as follows: during the charging of the capacitor (with the switch Kc closed and Kd open), the transistor M7 tends to conduct a current I by current mirror effect, but the transistor M8 tends to conduct a current that is greater than I for its gate/source voltage is initially smaller than VGP (M8 is a P channel transistor having a geometry such that it conducts a current I when its gate/source voltage is VGP). This creates an imbalance tending to draw the potentiel of the node B (between the transistors M7 and M8) towards Vcc. In the same way, during the charging of the capacitor, transistor M6 tends to conduct a current I while transistor M5 tends to conduct a current greater than I, since its gate/source voltage is initially higher than VGN (M5 is an N channel transistor, whose geometry is such that it conducts a current I when its gate/source voltage is VGN). This creates an imbalance tending to draw the potential of the rode D (between transistors M5 et M6) towards Vss.

The decision logic circuit CL is herein an RS type flip-flop circuit, the inputs of which are connected to the nodes B and D. It may be considered that the input D is a flip-over input and the input B is a restoring input. The flip-flop circuit changes state to close the switch Kc and open the switch Kd only when its input D goes from the low logic state to the high logic state, and the flip-flop circuit subsequently changes state to close the switch Kd and open the switch Kc only under the effect of the changing, to the low logic state, of the other input B. The other directions of change in the state of the nodes B and D have no influence on the flip-flop circuit.

Thus, during the charging of the capacitor, the closed state of the charging switch Kc is confirmed by the high logic state of the node B.

When the potential of the node A reaches the value Vcc−VGP, the transistor M8 is biased to conduct a current I. The node B descends towards Vss and changes its logic state. This causes the flip-over of the decision logic circuit CL, which then reverses the state of the switches Kc and Kd. Vcc-VGP represents the high threshold Vh of the comparator COMP1.

The discharging of the capacitor begins. First of all, the current from the transistor M8 again starts rising above I. This tends to reset the node B at the high logic state, but that does not affect the state of the flip-flop circuit which can now change state only under the action of the node D. Then the transistor M6 tends to conduct a current I, and the transistor M5 tends to conduct a current greater than I, so that the node D is drawn towards Vss. When the potential of the node A descends to the value Vss+VGN, the gate/source potential of the transistor M5 becomes just what is needed to conduct a current I like the transistor M6. The logic state of the node D tends to change towards the high logic state. The flip-flop circuit CL again changes state to recommence a charging cycle. The low flip-over threshold Vb of the comparator COMP2 is therefore Vss+VGN.

The difference Vh−Vb between the high and low thresholds is therefore equal to Vcc−Vss−VGP−VGN.

This is precisely what was desired.

The result of this, therefore, is that the capacitor C charging and discharging current, equal to I, hence to Ir/(K+K0), hence to (Vcc−Vss−VGP−VGN)/R(K+K0), as explained above, is really proportional to (Vcc−Vss−VGP−VGN), hence to Vh−Vb.

The period of the oscillator, assuming that the charging and discharging operations are perfectly linear, is:

$$T=2C(Vh-Vb)/I$$

It is therefore equal to $$T=2C(Vcc-Vss-VGP-VGN)/I,$$

and, since I=(Vcc−Vss−VGP−VGN)/R(K+K0), the period is $$T=2CR(K+K0)$$

It is independent of the supply voltage. It depends only on R and C and on the contents of the register. R and C depend on the technology and its fluctuations. K0 is known with precision (it is a ratio of geometry of transistors). K represents the contents of the register R1 chosen at will and capable precisely of being used to adjust the frequency as a function of the uncontrolled technological fluctuations of R and C.

We have thus described a means for the making, without difficulty, of a purely internal oscillator in an integrated circuit, without the drawbacks that resulted therefrom in the prior art and, especially, with a frequency that is independent of the supply voltage.

What is claimed is:

1. An integrated circuit including a relaxation oscillator that has a capacitor and means for charging and discharging the capacitor, a threshold comparator to trigger the charging of the capacitor when the voltage at the terminals of this capacitor goes below a low threshold Vb and to trigger the discharging of the capacitor when the voltage at the terminals of this capacitor goes above a high threshold Vh, wherein said oscillator further includes a register containing data for adjusting the frequency of the oscillator, said register controlling the selective parallel connection of elementary current sources as a function of its contents, the capacitor-charging and capacitor-discharging currents being linked to the currents of the elementary sources thus connected in parallel, and wherein the comparator sets up high and low thresholds Vh and Vb such that Vh−Vb is proportional to the current for charging and discharging the capacitor.

2. An integrated circuit according to claim 1, comprising a signal processor capable of loading the contents of the register.

3. An integrated circuit according to claim 2, wherein the contents of the register are loaded from a non-volatile memory formed on the same integrated circuit substrate and containing individual frequency correction data for the integrated circuit.

4. An integrated circuit according to any one of claims 2 and 3, wherein the oscillator is used to set up clock signals for the processor.

5. An integrated circuit according to claim 1, wherein the elementary current sources have weighted values, for example according to pure binary code, said weighting corresponding to an identical weighting or significance of the bits of the register.

6. An integrated circuit including a relaxation oscillator that has a capacitor and means for charging and discharging the capacitor, a threshold comparator to trigger the charging of the capacitor when the voltage at the terminals of this capacitor goes below a low threshold Vb and to trigger the discharging of the capacitor when the voltage at the terminals of this capacitor goes above a high threshold Vh, wherein said oscillator further includes a register containing data for adjusting the frequency of the oscillator, said register controlling the selective parallel connection of elementary current sources as a function of its contents, the capacitor-charging and capacitor-discharging currents being linked to the currents of the elementary sources thus connected in parallel, and wherein the comparator sets up high and low thresholds Vh and Vb such that Vh−Vb is proportional to the current for charging and discharging the capacitor, and further comprising a first P channel transistor for the charging of the capacitor, a second N channel transistor for the discharging of the capacitor, a third P channel transistor mounted as a current mirror with respect to the first transistor, in series with a fourth N channel transistor, the gate of which is connected to the capacitor and the geometry of which is chosen so that it conducts substantially the same current as the third transistor when its gate/source voltage is substantially equal to the gate/source voltage of the second transistor.

7. An integrated circuit according to claim 6, further comprising a fifth P channel transistor in series with a sixth N channel transistor, the sixth transistor being mounted as a current mirror with the second transistor, the fifth transistor having its gate connected to the capacitor and having its geometry chosen so that it conducts substantially the same current as the sixth transistor when its gate/source voltage is substantially equal to the gate/source voltage of the first transistor.

8. An integrated circuit including a relaxation oscillator that has a capacitor and means for charging and discharging the capacitor, a threshold comparator to trigger the charging of the capacitor when the voltage at the terminals of this capacitor goes below a low threshold Vb and to trigger the discharging of the capacitor when the voltage at the terminals of this capacitor goes above a high threshold Vh, wherein said oscillator further includes a register containing data for adjusting the frequency of the oscillator, said register controlling the selective parallel connection of elementary current sources as a function of its contents, the capacitor-charging and capacitor-discharging currents being linked to the currents of the elementary sources thus connected in parallel, and wherein the comparator sets up high and low thresholds Vh and Vb such that Vh−Vb is proportional to the current for charging and discharging the capacitor, wherein the register controls the selective turning on of branches of flow of current in parallel, each containing a transistor having a geometry that is well defined with respect to that of the other branches and being mounted as current mirrors with respect to one another, the sum of the currents generated by these branches being applied to a resistor, and wherein there is provision for transistors with a well defined geometry, mounted as current mirrors with respect to the transistors of these branches, to provide for the charging and discharging of the capacitor.

9. An integrated circuit according to claim 8, wherein the comparator includes transistors having a geometry that is well defined with respect to the transistors of the branches controlled by the register and mounted as current mirrors with respect to these transistors.

10. An integrated circuit including a relaxation oscillator, said oscillator including a capacitor, means for charging and discharging the capacitor, a threshold comparator to trigger the charging of the capacitor when the voltage at the terminals of this capacitor goes below a low threshold Vb and to trigger the discharging when the voltage goes above a high threshold Vh, wherein the charging and discharging means include:
   at least one first transistor mounted in series with a resistor and with a second transistor, the series-mounted unit being mounted between two supply terminals, each of the transistors having its drain connected to its gate;
   a third transistor mounted as a current mirror with respect to the first transistor, in series with a fourth transistor mounted as a current mirror with respect to the second transistor, the third transistor forming a source of charging current for the capacitor and the fourth transistor forming a source of discharging current,
and wherein the comparator includes at least one fifth transistor in series with a sixth transistor between the supply terminals, the sixth transistor being mounted as a current mirror with respect to the fourth transistor, and the fifth transistor having its gate connected to the capacitor and having a geometry chosen so that the current passing through it is substantially the current passing through the sixth transistor when the gate/source voltage of the fifth transistor is substantially equal to the gate/source voltage of the first and third transistors.

* * * * *